United States Patent
Kawai

(10) Patent No.: US 8,772,754 B2
(45) Date of Patent: Jul. 8, 2014

(54) SEMICONDUCTOR STORAGE DEVICE COMPRISING A MEMORY CELL ARRAY INCLUDING A RECTIFYING ELEMENT AND A VARIABLE RESISTOR

(75) Inventor: Murato Kawai, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/402,058

(22) Filed: Feb. 22, 2012

(65) Prior Publication Data

US 2012/0211721 A1    Aug. 23, 2012

(30) Foreign Application Priority Data

Feb. 23, 2011  (JP) ................................. 2011-036643

(51) Int. Cl.
*H01L 29/06*    (2006.01)
(52) U.S. Cl.
USPC . 257/5; 257/4; 257/8; 257/537; 257/E27.004; 438/128; 438/382; 438/385
(58) Field of Classification Search
None
See application file for complete search history.

(56) References Cited

U.S. PATENT DOCUMENTS

| | | | | |
|---|---|---|---|---|
| 6,004,874 A | * | 12/1999 | Cleeves | 438/622 |
| 2001/0034123 A1 | * | 10/2001 | Jeon et al. | 438/643 |
| 2006/0216954 A1 | * | 9/2006 | Wang | 438/785 |
| 2008/0248632 A1 | * | 10/2008 | Youn et al. | 438/483 |
| 2010/0038617 A1 | * | 2/2010 | Nakajima et al. | 257/2 |
| 2011/0147942 A1 | | 6/2011 | Yahashi et al. | |

FOREIGN PATENT DOCUMENTS

JP    2010-67942    3/2010

* cited by examiner

*Primary Examiner* — Marcos D. Pizarro
*Assistant Examiner* — Cesar Lopez
(74) *Attorney, Agent, or Firm* — Oblon, Spivak, McClelland, Maier & Neustadt, L.L.P.

(57) ABSTRACT

A method of manufacturing a semiconductor storage device according to an embodiment includes: stacking a first wiring layer; stacking a memory cell layer on the first wiring layer; and stacking a stopper film on the memory cell layer. The method of manufacturing a semiconductor storage device also includes: etching the stopper film, the memory cell layer, and the first wiring layer; polishing an interlayer insulating film to the stopper film after burying the stopper film, the memory cell layer, and the first wiring layer with the interlayer insulating film; performing a nitridation process to the stopper film and the interlayer insulating film to form an adjustment film and a block film on surfaces of the stopper film and the interlayer insulating film, respectively; and forming a second wiring layer on the adjustment film, the second wiring layer being electrically connected to the adjustment film.

12 Claims, 10 Drawing Sheets

SEMICONDUCTOR STORAGE DEVICE COMPRISING A MEMORY CELL ARRAY INCLUDING A RECTIFYING ELEMENT AND A VARIABLE RESISTOR

CROSS REFERENCE TO RELATED APPLICATION

This application is based upon and claims the benefit of priority from prior Japanese Patent Application No. 2011-036643, filed on Feb. 23, 2011, the entire contents of which are incorporated herein by reference.

BACKGROUND

1. Field

Embodiments described herein relate to a semiconductor storage device comprising an arrangement of memory cells, the memory cells configured to store data by change in a resistance value of a variable resistor, and a manufacturing method thereof.

2. Description of the Related Art

Recently a resistance change memory device in which a variable resistor is used as a storage element attracts attention as one of subsequent candidates of a flash memory. It is assumed that the resistance change memory device includes a resistance change memory (ReRAM: Resistive RAM) in its narrow definition, in which a recording layer is made of transition metal oxide and a resistance-value state of the recording layer is stored in a nonvolatile manner, and a phase change memory (PCRAM: Phase Change RAM), in which the recording layer is made of chalcogenide or the like and resistance value information of a crystal state (conductor) and an amorphous state (insulator) of the recording layer are utilized.

In the memory cell of the resistance change memory device, a cell array is formed by stacking the variable resistor and a rectifying element such as a diode at intersections of bit lines and word lines, without using a transistor. Thus, a high-density memory cell array can be constructed. Furthermore, arranging this kind of memory cell array to be stacked three-dimensionally makes it possible to achieve a large capacity, without increasing cell array area.

In order to achieve the large-capacity memory cell array, it is necessary that a desired current flows even in a fine wiring. Therefore, it is necessary to reduce a resistance of the wiring.

DETAILED DESCRIPTION

Figure 1:
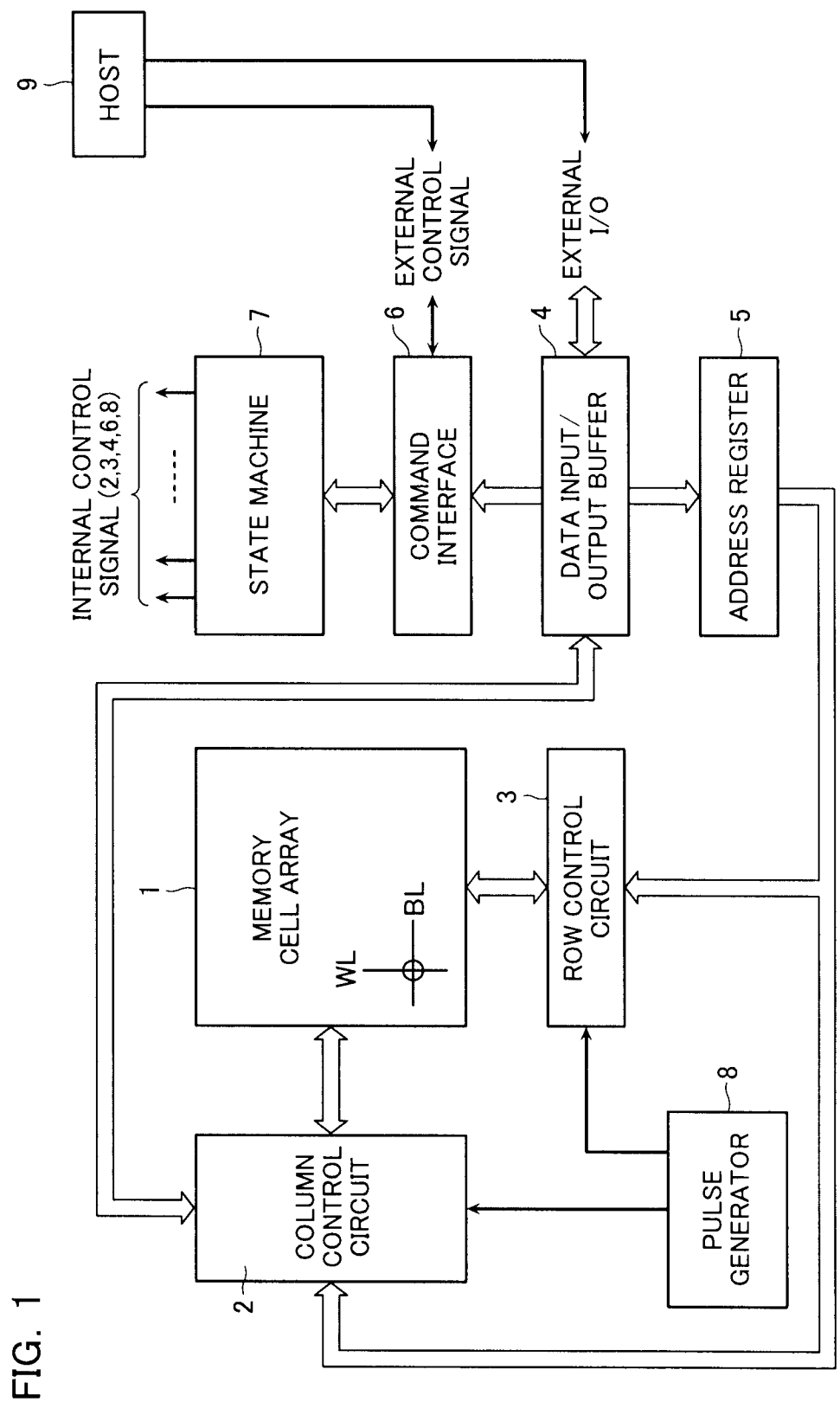
FIG. 1 is a block diagram of a semiconductor storage device in accordance with a first embodiment of the present invention.

A method of manufacturing a semiconductor storage device according to an embodiment includes: stacking a first wiring layer; stacking a memory cell layer on the first wiring layer, the memory cell layer being electrically connected to the first wiring layer, and having a first electrode, a rectifying element, a second electrode, a variable resistor, and a third electrode that are sequentially deposited; and stacking a stopper film on the memory cell layer in order to decelerate a polishing process to be performed later, the stopper film being electrically connected to the memory cell layer. The method of manufacturing a semiconductor storage device also includes: etching the stopper film, the memory cell layer, and the first wiring layer; polishing an interlayer insulating film to the stopper film after burying the stopper film, the memory cell layer, and the first wiring layer with the interlayer insulating film; and performing a nitridation process to the stopper film and the interlayer insulating film to form an adjustment film and a block film on surfaces of the stopper film and the interlayer insulating film, respectively. The method of manufacturing a semiconductor storage device also includes forming a second wiring layer on the adjustment film to form a memory cell disposed at each intersection where the second wiring layer intersects etched one of the first wiring layer, the second wiring layer being electrically connected to the adjustment film.

Hereinafter, embodiments of the present invention will be described in detail with reference to the drawings. In the drawings of the embodiment, a component having the same configuration is designated by the same numeral, and the redundant description is omitted.

[Entire Configuration]

FIG. 1 is a block diagram of a nonvolatile memory in accordance with a first embodiment of the present invention. The nonvolatile memory comprises a memory cell array 1 of memory cells arranged in a matrix, each memory cell including a later-described ReRAM (variable resistor).

A column control circuit 2 is provided at a position adjacent to the memory cell array 1 in a bit line BL direction. The column control circuit 2 controls the bit line BL in the memory cell array 1 to erase data in the memory cell, write data to the memory cell, and read data from the memory cell. A row control circuit 3 is provided at a position adjacent to the memory cell array 1 in a word line WL direction. The row control circuit 3 selects the word line WL in the memory cell array 1 and applies voltages required to erase data in the memory cell, write data to the memory cell, and read data from the memory cell.

A data input/output buffer 4 is connected to an external host 9 via an input/output (I/O) line to receive write data, receive erase instructions, output read data, and receive address data and command data. The data input/output buffer 4 sends received write data to the column control circuit 2 and receives read data from the column control circuit 2 and outputs it to external. An address supplied from external to the data input/output buffer 4 is sent via an address register 5 to the column control circuit 2 and the row control circuit 3.

A command supplied from the host 9 to the data input/output buffer 4 is sent to a command interface 6. The command interface 6 receives an external control signal from the host 9 and determines whether the data inputted to the data input/output buffer 4 is write data, a command or an address. If the data is a command, then the command interface 6 transfers it as a received command signal to a state machine 7.

The state machine 7 manages the entire nonvolatile memory to receive commands from the host 9 via the command interface 6, and perform read, write, erase, data input/output management, and so on. The external host 9 can also receive status information managed by the state machine 7 and decide the operation result. The status information is also utilized in control of write and erase. Further, the state machine 7 controls a pulse generator 8. Under this control, the pulse generator 8 is allowed to output a pulse of any voltage at any timing.

The pulse formed herein can be transferred to any line selected by the column control circuit 2 and the row control circuit 3. Note that peripheral circuit elements other than the memory cell array 1 can be formed in a silicon substrate immediately beneath the memory cell array 1 formed in a wiring layer. Thus, the chip area of the nonvolatile memory can be made almost equal to the area of the memory cell array 1.

[Memory Cell Array 1]

Figure 2:
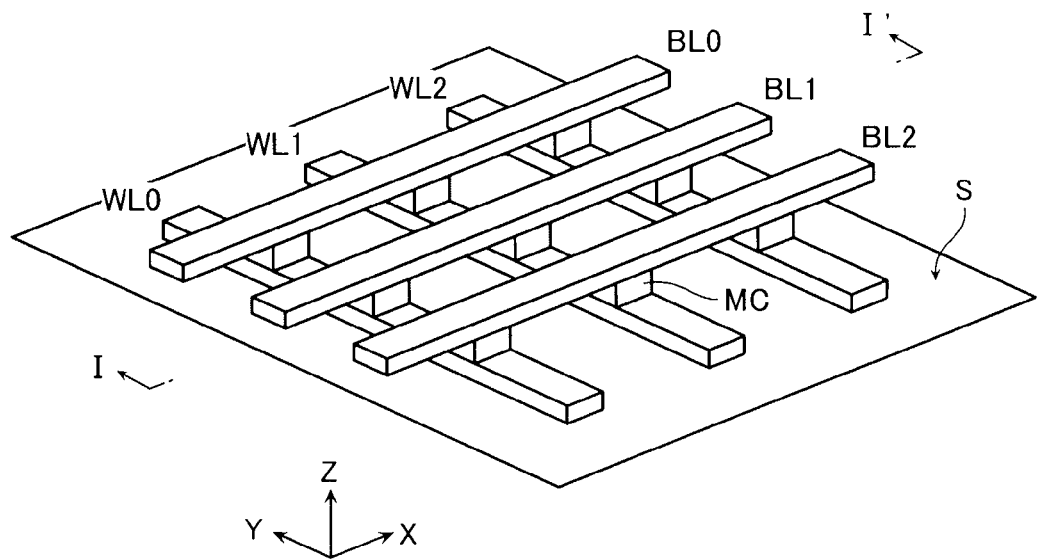
FIG. 2 is a perspective view of part of a memory cell array 1.
Figure 3:
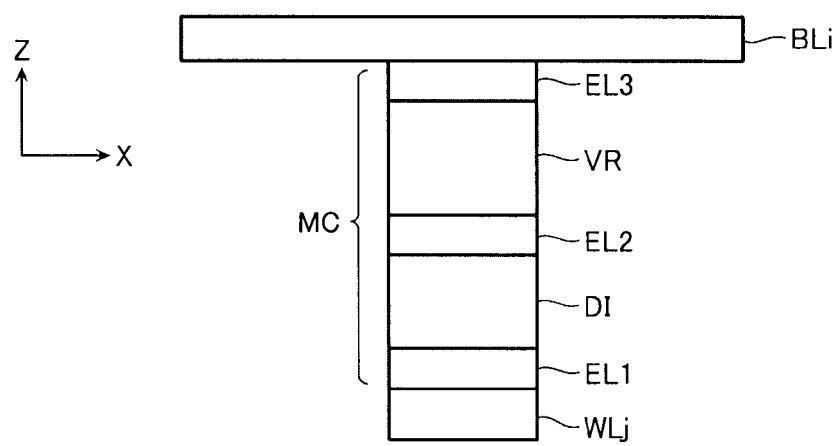
FIG. 3 is a cross-sectional view of one memory cell taken along the line I-I' and seen in the direction of the arrows in FIG. 2.

FIG. 2 is a perspective view of part of the memory cell array 1, and FIG. 3 is a cross-sectional view of one memory cell taken along the line I-I' and seen in the direction of the arrows in FIG. 2. Word lines WL0-WL2 are provided as plural first wirings in a Y-direction parallel to a surface of a semiconductor substrate S, and bit lines BL0-BL2 are provided as plural second wirings in an X-direction parallel to the surface of the semiconductor substrate S. The word lines WL0-WL2 are provided to intersect the bit lines BL0-BL2. A memory cell MC is disposed in each of intersections of the word lines WL0-WL2 and the bit lines BL0-BL2 to be sandwiched therebetween. Desirably, the first and second wirings are composed of a heat-resistive low-resistance material such as W, WSi, NiSi, or CoSi. A detailed configuration of the memory cell array 1 is described later.

[Memory Cell MC]

As illustrated in FIG. 3, the memory cell MC is a circuit in which a variable resistor VR and a diode DI as a rectifying element are connected in series in a Z-direction perpendicular to the semiconductor substrate S. A material that can change a resistance value through a current, heat, chemical energy by voltage application is used as the variable resistor VR. Electrodes EL1, EL2, and EL3 that act as a barrier metal and an adhesive layer are disposed above and below the variable resistor VR and the diode DI. The diode DI is disposed on the electrode EL1, and the electrode EL2 is disposed on the diode DI. The variable resistor VR is disposed on the electrode EL2, and the electrode EL3 is disposed on the variable resistor VR. For example, a titanium nitride (TiN) can be used as the material for the electrodes EL1, EL2, and EL3. The electrodes EL1, EL2, and EL3 may be made of different materials. For example, Pt, Au, Ag, TiAlN, SrRuO, Ru, RuN, Ir, Co, Ti, TaN, LaNiO, Al, PtIrO$_x$, PtRhO$_x$, Rh, TaAlN, and W can be used as the materials for the electrodes EL1 and EL3. For example, W, WN, TaN, TaSiN, TaSi$_2$, TiC, TaC, and Nb—TiO$_2$ can be used as the material for the electrode EL2. Alternatively, a buffer layer, a barrier metal layer, and an adhesive layer may separately be inserted.

[Diode DI]

For example, a PN junction diode including a p-type layer and an n-type layer is used as the diode DI. In addition to the PN junction diode, various diodes such as a Schottky diode and a PIN diode can be used as the diode DI.

[Variable Resistor VR]

Figure 4:
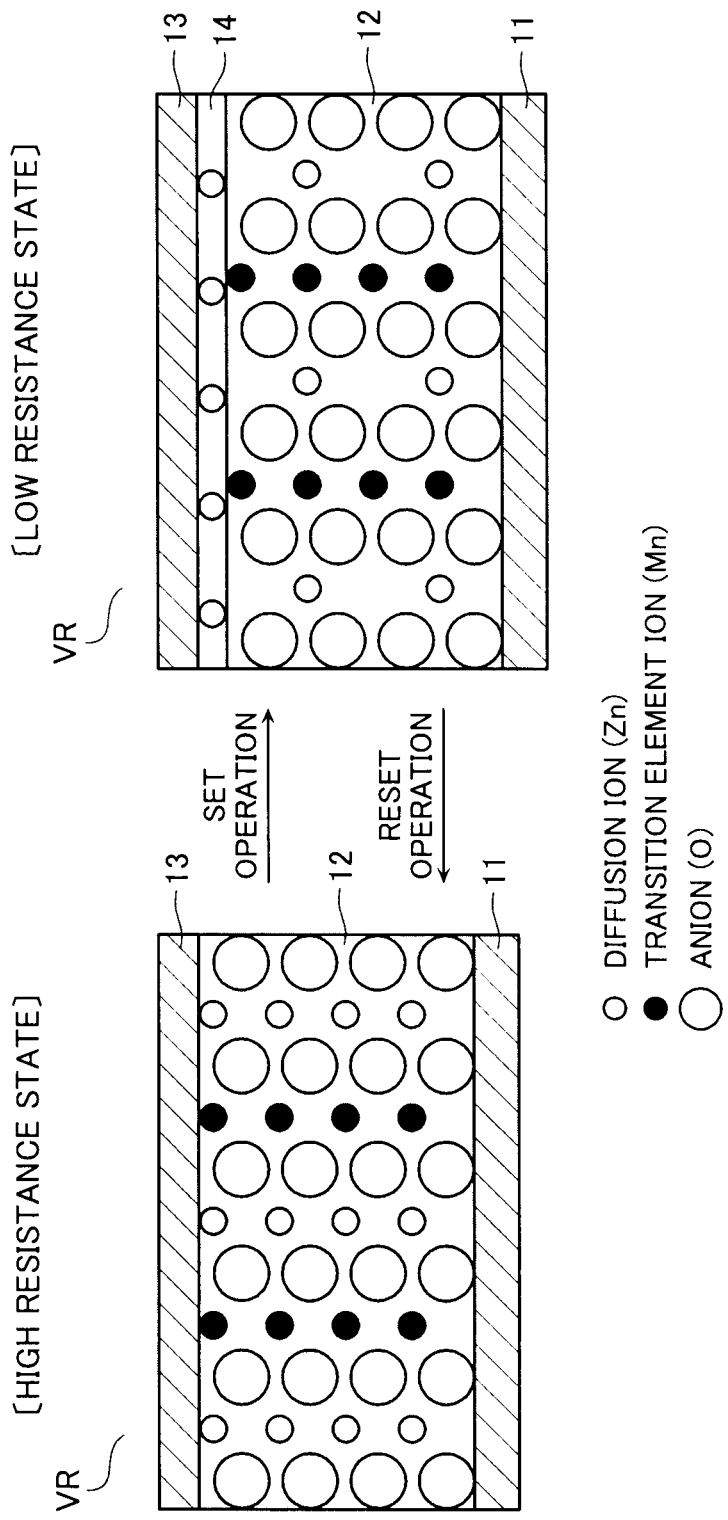
FIG. 4 is a view showing an example of a variable resistor VR.
Figure 5:
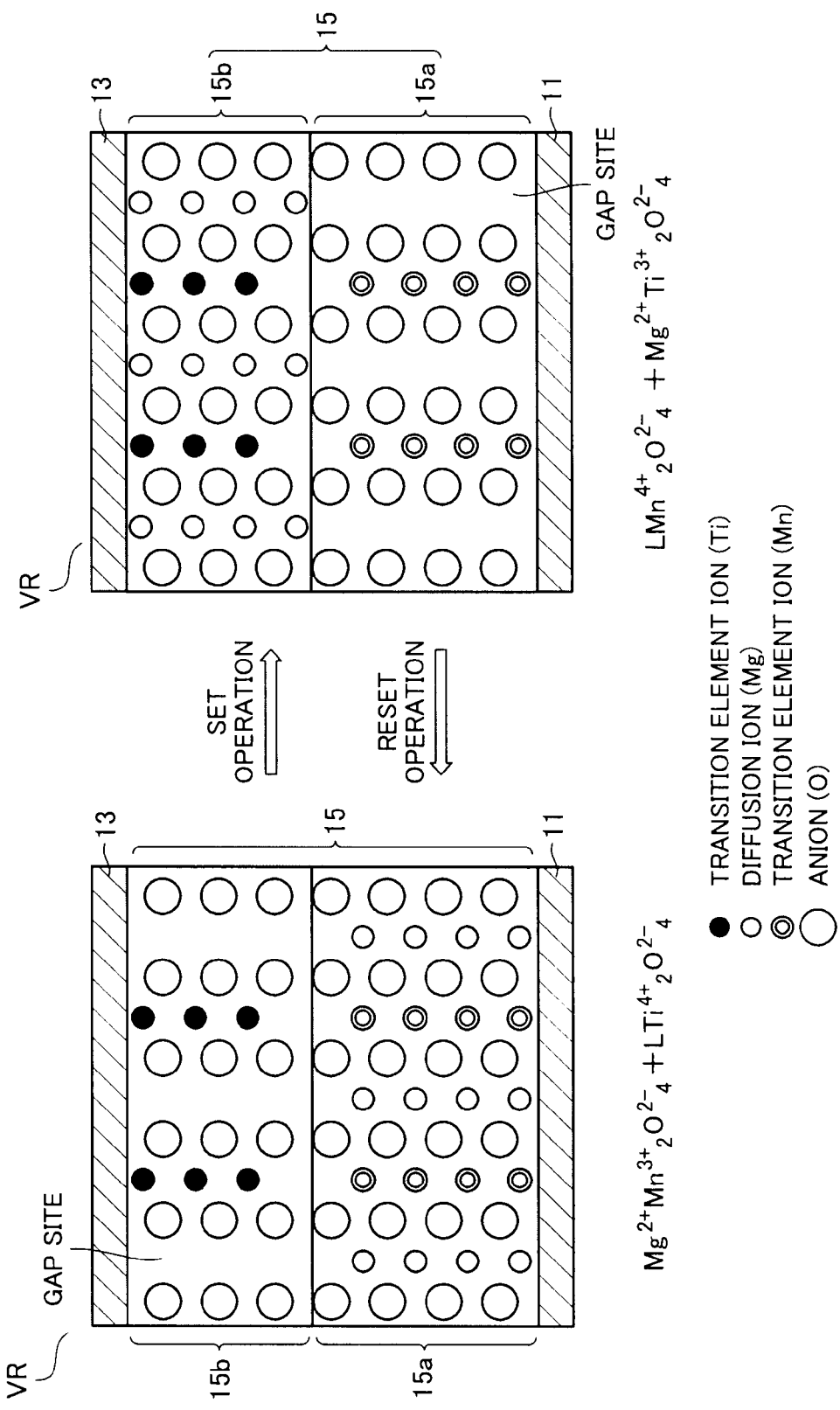
FIG. 5 is a view showing an example of a variable resistor VR.

The variable resistor VR may include one that comprises a composite compound containing cations of a transition element and varies the resistance through migration of the cations (ReRAM). FIGS. 4 and 5 show examples of the variable resistor VR. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be configured by material having a crystalline structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$) a hollandite structure ($A_xMO_2$), a ramsdellite structure ($A_xMO_2$), and a perovskite structure ($AMO_3$).

The data is written in the memory cell MC by applying a certain voltage to the variable resistor VR for a short time. Therefore, the variable resistor VR is changed from a high-resistance state to a low-resistance state. Hereinafter an operation to change the variable resistor VR from the high-resistance state to the low-resistance state is referred to as a set operation. On the other hand, the data is erased from the memory cell MC by applying a certain voltage to a variable resistor VR for a long time, the certain voltage being lower than the voltage applied during the set operation, and the variable resistor VR being one in the low-resistance state subsequent to the set operation. Therefore, the variable resistor VR is changed from the low-resistance state to the high-resistance state. Hereinafter an operation to change the variable resistor VR from the low-resistance state to the high-resistance state is referred to as a reset operation. The memory cell MC adopts, for example, the high-resistance state as a stable state (reset state), and, in the case of binary data storage, write of data is performed by the set operation in which the reset state is changed to the low-resistance state.

In the example of FIG. 4, ZnMn$_2$O$_4$ is used as the complex compound, and A is Zn, M is Mn, and X is O. Alternatively, the variable resistor VR may be formed by a thin film made of one of materials such as NiO, TiO$_2$, HfO$_x$, SrZrO$_3$, and Pr$_{0.7}$Ca$_{0.3}$MnO$_3$. In the recording layer 12 of FIG. 4, a small white circle indicates a diffusion ion (Zn), a large white circle indicates an anion (O), and a small black circle indicates a transition element ion (Mn). An initial state of the recording layer 12 is in the high-resistance state. When a negative voltage is applied onto the electrode layer 13 while the electrode layer 11 is set to a fixed potential, some of the diffusion ions in the recording layer 12 move onto the electrode layer 13, and the number of diffusion ions in the recording layer 12 is decreased relative to the number of anions. The diffusion ion that moves onto the electrode layer 13 receives the electron from the electrode layer to be precipitated as a metal, thereby forming a metallic layer 14. The anion becomes excessive in the recording layer 12, and therefore a valence of the transition element ion is increased in the recording layer 12. Therefore, the recording layer possesses electron conductivity by carrier injection, and the set operation is completed. On reading, a current may be allowed to flow, of which value is very small so that the material configuring the recording layer 12 causes no resistance variation. The programmed state (low-resistance state) may be reset to the erased state (high-resistance state) by supplying a large current flow in the recording layer 12 for a sufficient time, which causes Joule heating to facilitate the oxidation reduction reaction in the recording layer 12. The reset operation may be performed by applying an electric field in an opposite direction to the set operation.

In the example of FIG. 5, a recording layer 15 sandwiched between the electrode layers 11 and 13 is formed by two layers of a first compound layer 15a and a second compound layer 15b. The first compound layer 15a is disposed on the side of the electrode layer 11, and expressed by a chemical formula $A_xM1_yX1_z$. The second compound layer 15b is disposed on the side of the electrode layer 13 while having gap sites in which the cation element of the first compound layer 15a can be accommodated.

In the example of FIG. 5, A is Mg, M1 is Mn, and X1 is O in the first compound layer 15a. Ti indicated by the black circle is contained as the transition element ion in the second compound layer 15b. In the first compound layer 15a, the small white circle indicates the diffusion ion (Mg), the large white circle indicates the anion (O), and a double circle indicates the transition element ion (Mn). Note that the first compound layer 15a and the second compound layer 15b may be stacked in multiple layers such as two or more layers.

In the variable resistor VR, the potentials are provided to the electrode layers 11 and 13 such that the first compound layer 15a becomes a positive electrode side while the second compound layer 15b becomes a negative electrode side, and a potential gradient is generated in the recording layer 15. Therefore, some of the diffusion ions in the first compound layer 15a migrate through the crystal to enter the second compound layer 15b on the negative electrode side. Because the gap sites that can accommodate the diffusion ion therein exist in the crystal of the second compound layer 15b, the diffusion ion that moves from the first compound layer 15a is accommodated in the gap sites. Therefore, the valence of the transition element ion in the first compound layer 15a is increased while the valence of the transition element ion in the second compound layer 15b is decreased. In the initial state, when the first and second compound layers 15a and 15b are in the high-resistance state, some of the diffusion ions in the first compound layer 15a move into the second compound layer 15b, and conduction carriers are generated in the first and second compound layers 15a and 15b, whereby the first and second compound layers 15a and 15b possess the electric conductivity.

Note that the programmed state (low-resistance state) may be reset to the erased state (high-resistance state) by supplying a large current flow in the recording layer 15 for a sufficient time for Joule heating to facilitate the oxidation reduction reaction in the recording layer 15, similarly to the preceding example. The reset operation may be performed by applying an electric field in an opposite direction to the set operation.

MODIFIED EXAMPLE OF MEMORY CELL ARRAY

Figure 6:
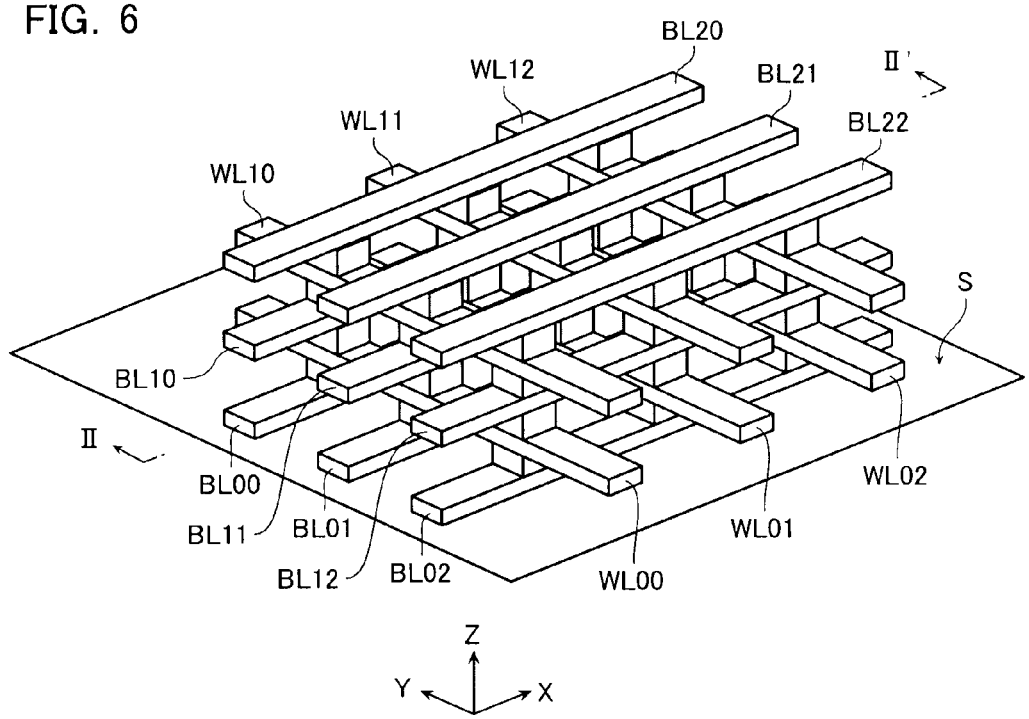
FIG. 6 is a perspective view of part of a memory cell array 1 of another configuration example.
Figure 7:
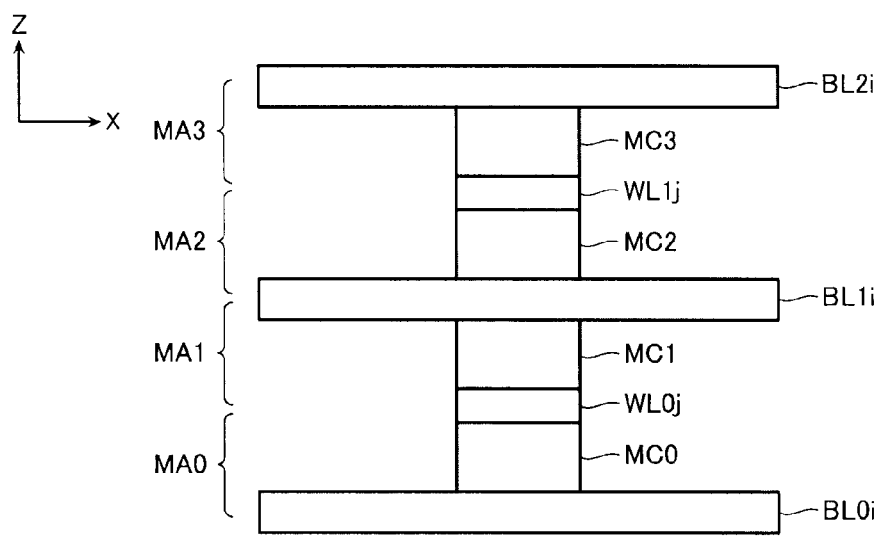
FIG. 7 is a cross-sectional view taken along the line II-II' and seen in the direction of the arrows in FIG. 6.

Moreover, as shown in FIG. 6, plural such memory structures described above may be stacked to form a three-dimensional structure. FIG. 7 is a cross-sectional view showing a II-II' section in FIG. 6. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3.

In place of the line/cell/line/cell repetition, an interlayer insulating film may be interposed as a line/cell/line/interlayer-insulating-film/line/cell/line between cell array layers. Note that the memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

[Memory Cell Array and Peripheral Circuits]

Figure 8:
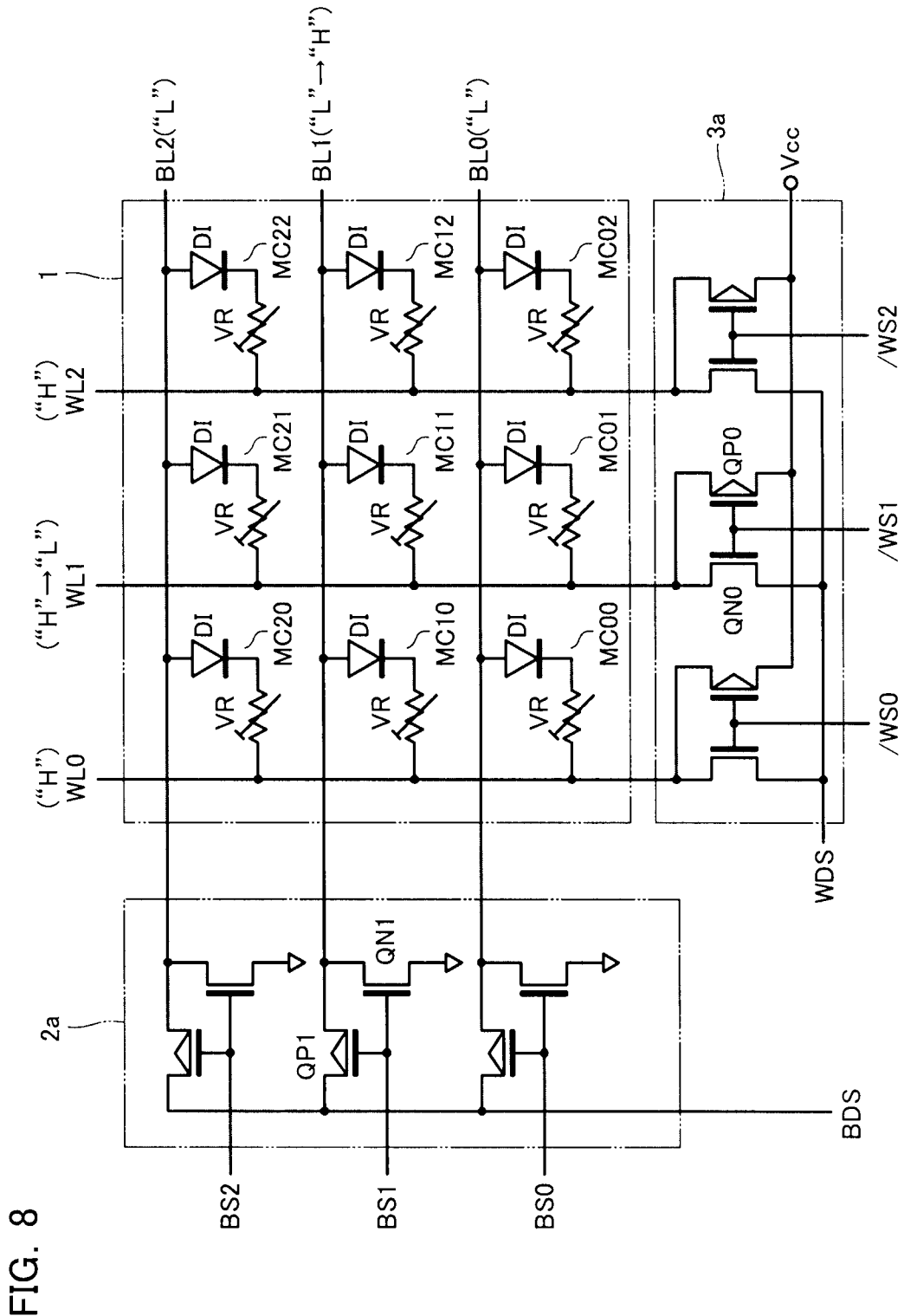
FIG. 8 is a circuit diagram of the memory cell array 1 and peripheral circuits thereof.

FIG. 8 is a circuit diagram illustrating the memory cell array 1 and peripheral circuits thereof. For the sake of convenience, one layer in the stacked structure will be described by way of example. Referring to FIG. 8, an anode of the diode DI contained in the memory cell MC is connected to the bit line BL, and a cathode is connected to the word line WL through the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP1 and a selection NMOS transistor QN1, which are provided in each bit line BL. Gates and drains of the selection PMOS transistor QP1 and the selection NMOS transistor QN1 are commonly connected. A source of the selection PMOS transistor QP1 is connected to a bit-line-side drive sense line BDS. A write pulse is applied to the bit-line-side drive sense line BDS, and the current to be detected flows through the bit-line-side drive sense line BDS during the data read. A source of the selection NMOS transistor QN1 is connected to a low potential power supply Vss. The common drain of the transistors QP1 and QN1 is connected to the bit line BL, and a bit line selection signal BSi (i=0-2) is supplied to the common gate in order to select each bit line BL.

The selection circuit 3a includes a selection PMOS transistor QP0 and a selection NMOS transistor QN0, which are provided in each word line WL. Gates and drains of the selection PMOS transistor QP0 and the selection NMOS transistor QN0 are commonly connected. A source of the selection PMOS transistor QP0 is connected to a high potential power supply Vcc. A source of the selection NMOS transistor QN0 is connected to a word-line-side drive sense line WDS. The write pulse is applied to the word-line-side drive sense line WDS, and the current to be detected flows through the word-line-side drive sense line WDS during the data read. The common drain of the transistors QP0 and QN0 is connected to the word line WL, and a word line selection signal /WSi (i=0-2) is supplied to the common gate in order to select each word line WL.

[Configuration of Memory Cell Array 1]

Figure 9:
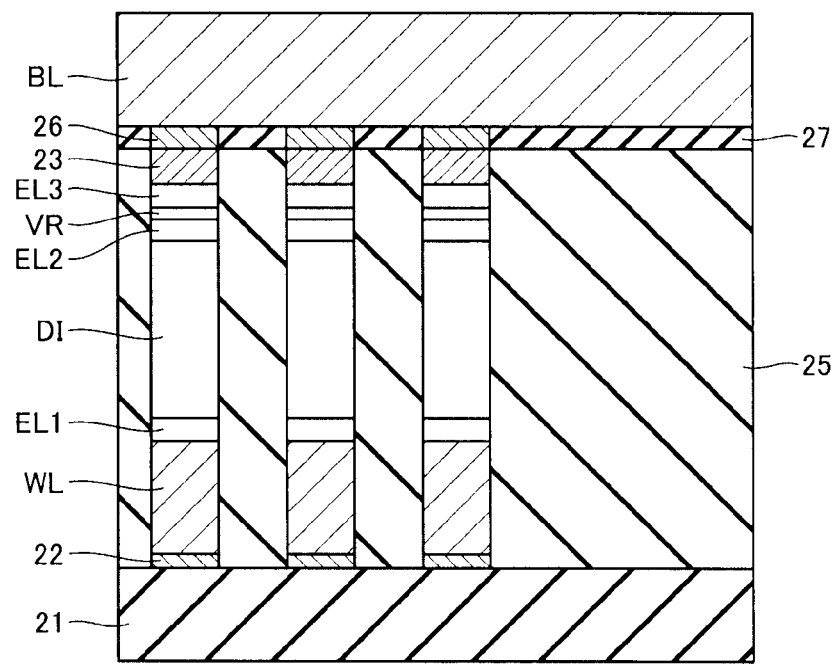
FIG. 9 is a sectional view illustrating a structure of the memory cell array in the first embodiment.

The detailed configuration of the memory cell array 1 will be described below with reference to FIG. 9. FIG. 9 is a sectional view illustrating a structure of the memory cell array 1 of the embodiment. As described above, in the memory cell array 1 of the embodiment, the memory cell MC in which the variable resistor VR and the diode DI are connected in series is provided in the intersection of the bit line BL and the word line WL.

As illustrated in FIG. 9, an interlayer insulating film 21 is provided such that a CMOS circuit (not illustrated) formed on the semiconductor substrate is covered therewith. The word line WL is provided on the interlayer insulating film 21. A barrier metal film 22 is provided between the word line WL and the interlayer insulating film 21. For example, the word line WL is formed by a tungsten (W) film, and the barrier metal film 22 is formed by a tungsten nitride (WN) film. The electrode EL1 that acts as the barrier metal or the adhesive layer is provided on the word line WL. The diode DI as the rectifying element is provided on the electrode EL1, and the electrode EL2 is provided on the diode DI. The variable resistor VR is provided on the electrode EL2, and the electrode EL3 is provided on the variable resistor VR.

In the memory cell array 1 of the embodiment, a stopper film 23 and an adjustment film 26 formed by nitriding part of the stopper film 23 are provided on the electrode EL3. The stopper film 23 is provided in order to stop CMP (Chemical Mechanical Polishing) during a manufacturing process. The adjustment film 26 is used to reduce an influence of an orientation possessed by the electrode EL3. Tungsten (W) can be cited as an example of the material used as the stopper film 23. In this case, the stopper film 23 is a tungsten film, and the adjustment film 26 is a tungsten nitride film.

A space of the memory cell array 1 is filled with an interlayer insulating film 25. A block film having the substantially same thickness as the adjustment film 26 is provided on an upper surface of the interlayer insulating film 25. The block film 27 is provided in order to suppress an influence of gas emitted from the interlayer insulating film 25. For example, a polysilazane (PSZ) film is used as the interlayer insulating film 25, and a nitride film of the polysilazane (PSZ) film is used as the block film 27. The bit line BL is provided on the adjustment film 26 and the block film 27 so as to intersect the word line WL. For example, the bit line BL is formed by the tungsten (W) film.

[Memory Cell Array Manufacturing Method]

A method for manufacturing the memory cell array 1 will be described below with reference to FIGS. 10 to 14. FIGS. 10 to 14 are process charts illustrating the method for manufacturing the memory cell array 1 of the embodiment.

Figure 10:
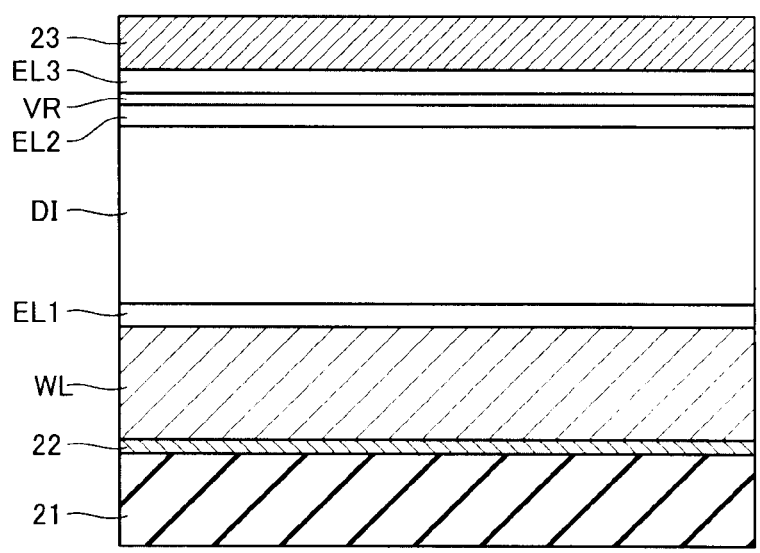
FIG. 10 is a process chart illustrating a method for manufacturing the memory cell array in the first embodiment.

As illustrated in FIG. 10, the interlayer insulating film 21 is stacked such that the CMOS circuit (not illustrated) formed on the semiconductor substrate S is covered therewith. Then the tungsten nitride film and the tungsten film, which become the wiring layer through the following processes, are deposited with a thickness of 50 nm by a sputtering method. The tungsten nitride film becomes the barrier metal film 22 through the following processes, and the tungsten film becomes the word line WL through the following processes. Only the word line WL may be provided while the tungsten nitride film is omitted.

Then the titanium nitride (TiN) film is deposited with the thickness of 5 nm by the sputtering method. The titanium nitride film becomes the electrode EL1 through the following processes. An amorphous silicon layer in which phosphorus (P) is doped, an undoped amorphous silicon layer, and an amorphous silicon layer in which boron (B) is doped are deposited on the electrode EL1 by an LPCVD method. The doping order of phosphorus and boron may be reversed depending on the direction of the rectifying element in the memory cell array 1. The amorphous silicon layer becomes the diode DI through the following processes. Then a natural oxidation film formed on the surface of the amorphous silicon layer is removed by a wet treatment.

Then the titanium nitride (TiN) film is deposited with the thickness of 5 nm by the sputtering method. The titanium nitride film becomes the electrode EL2 through the following processes. Then, the variable resistor VR is deposited by the LPCVD method or the sputtering method, and the titanium nitride (TiN) film that becomes the electrode EL3 through the following processes is deposited by the sputtering method. In addition to TiN, for example, Pt, Au, Ag, TiAlN, SrRuO, Ru, RuN, Ir, Co, Ti, TaN, LaNiO, Al, PtIrO$_x$, PtRhO$_x$, Rh, and TaAlN can be cited as the materials for the electrodes EL1, EL2, and EL3. Then the stopper film 23 that acts as a stopper (a polishing process hardly proceeds for a stopper material because of a low polishing rate) of CMP to be performed later is formed by tungsten.

Figure 11:
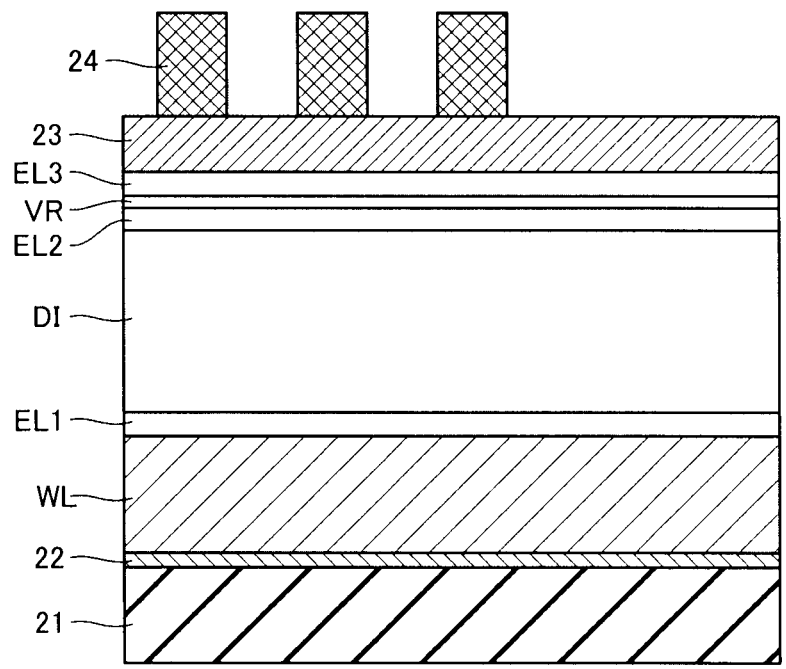
FIG. 11 is a process chart illustrating the method for manufacturing the memory cell array in the first embodiment.
Figure 12:
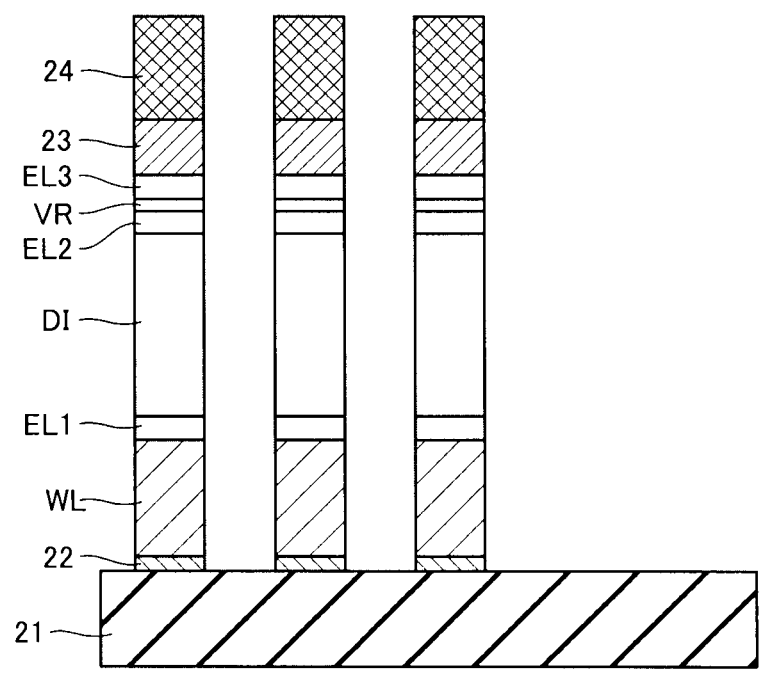
FIG. 12 is a process chart illustrating the method for manufacturing the memory cell array in the first embodiment.
Figure 13:
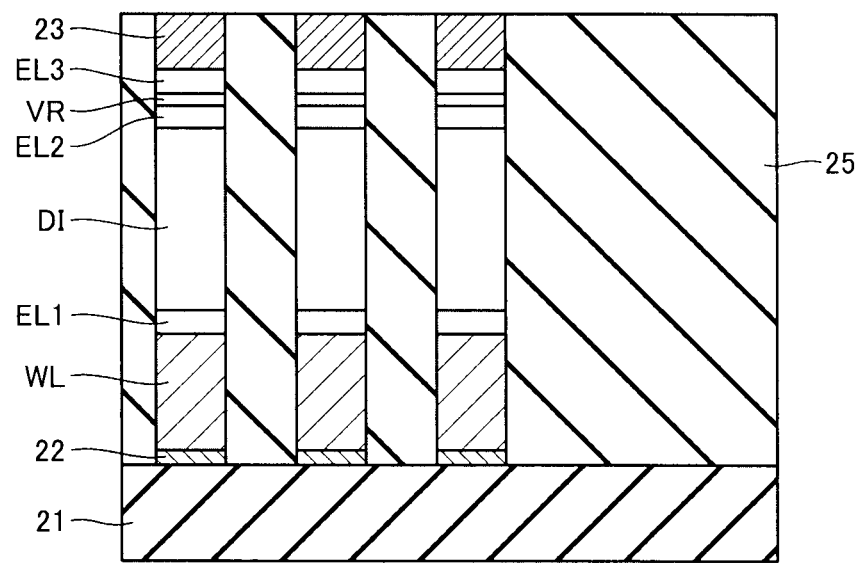
FIG. 13 is a process chart illustrating the method for manufacturing the memory cell array in the first embodiment.

As illustrated in FIG. 11, after a resist 24 is stacked on the stopper film 23, patterning is performed by a lithography method. As illustrated in FIG. 12, the stopper film 23, the variable resistor VR, the diode DI, and the word line WL are processed by an RIE method. As illustrated in FIG. 13, after the interlayer insulating film 25 is deposited, planarization is performed by the CMP method. The CMP process is performed to the stopper film 23.

Figure 14:
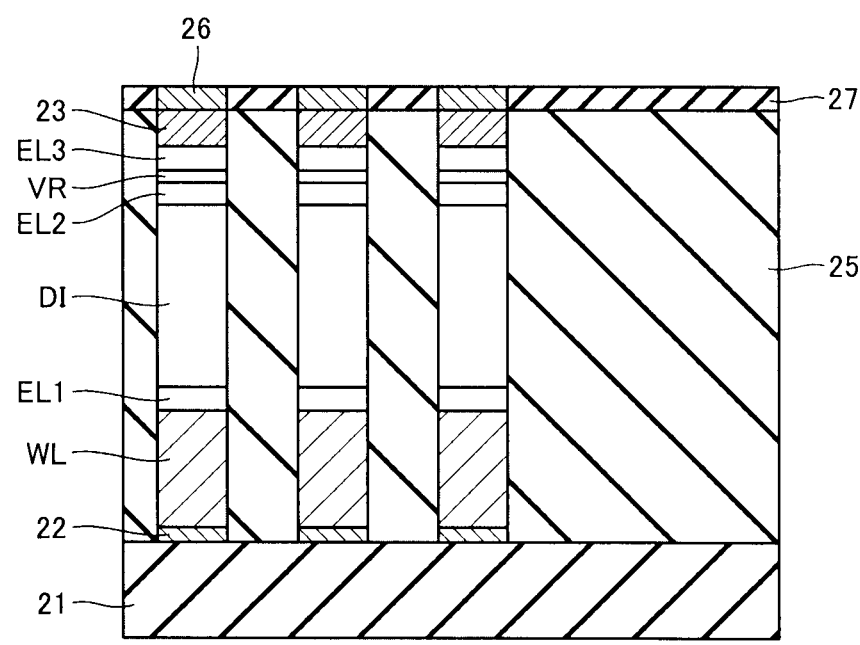
FIG. 14 is a process chart illustrating the method for manufacturing the memory cell array in the first embodiment.

As illustrated in FIG. 14, a nitridation process is performed to the surfaces of the stopper film 23 and the interlayer insulating film 25. Through the nitridation process, the nitride film having the thickness of 3-4 nm is formed on the surface of the polysilazane (PSZ) film that is used as the interlayer insulating film 25. The nitride film becomes the block film 27 that reduces the influence of the gas emitted from the interlayer insulating film 25. The surface of the stopper film that is used to stop the CMP process is also nitrided through the nitridation process to form the tungsten nitride (WN) film. The tungsten nitride film becomes the adjustment film 26 that reduces the influence of the orientation of TiN used as the electrode EL3.

Then the tungsten film is deposited with the thickness of 50 nm by the sputtering method. After a resist is stacked on the tungsten film, the patterning is performed by the lithography method, and the tungsten film, the variable resistor VR, and the diode DI are processed by the RIE method. Therefore, the bit line BL is formed so as to intersect the word line WL. After the interlayer insulating film is deposited, the planarization is performed by the CMP method to form the semiconductor storage device of the embodiment illustrated in FIG. 9.

[Effect]

Figure 15:
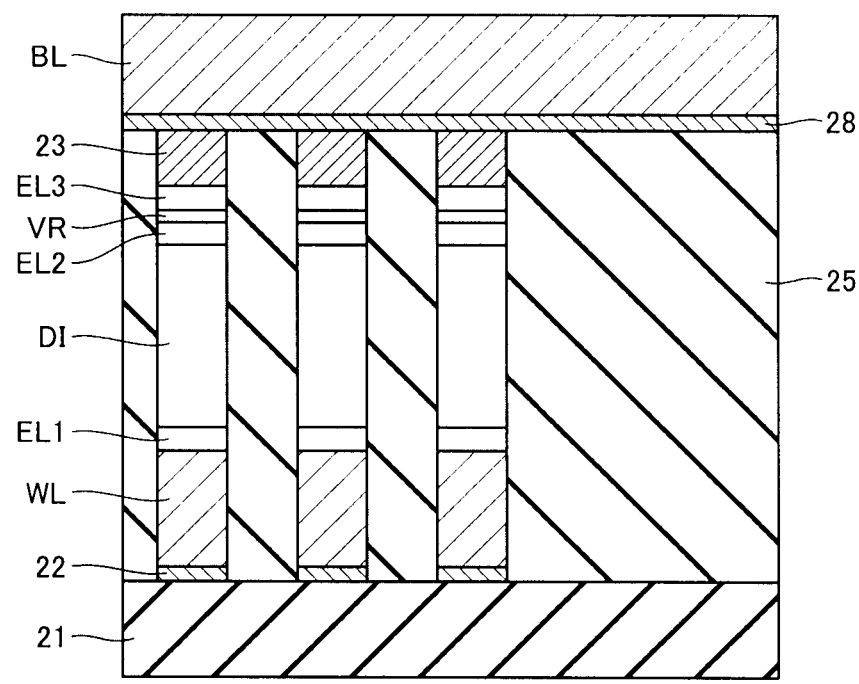
FIG. 15 is a sectional view illustrating a structure of a memory cell array according to a comparative example.

An effect of the memory cell array 1 of the embodiment will be described below with reference to a memory cell array 1 according to a comparative example illustrated in FIG. 15. FIG. 15 is a sectional view illustrating a structure of the memory cell array 1 of the comparative example. In the memory cell array of the comparative example, the memory cell MC in which the variable resistor VR and the diode DI are connected in series is provided in the intersection of the bit line BL and the word line WL. However, the memory cell array 1 of the comparative example differs from the memory cell array 1 of the embodiment of FIG. 9 in that the nitridation process is not performed to the surfaces of the stopper film 23 and the interlayer insulating film 25 and that the memory cell array 1 of the comparative example does not include the adjustment film 26 and the block film 27. The memory cell array 1 of the comparative example of FIG. 15 differs also from the memory cell array 1 of the embodiment in that a barrier metal film 28 configured by the tungsten nitride (WN) film is provided below the bit line BL.

As illustrated in FIG. 15, the space between the bit lines BL, the space between the word lines WL, and the space between the memory cells MC are filled with the interlayer insulating film 25 when the memory cell array is three-dimensionally arrayed. The interlayer insulating film 25 emits an H$_2$O gas or an O$_2$ gas, and the bit line BL may be oxidized by the influence of the gas to increase the resistance. In addition, the electrode EL3 on the variable resistor VR may have the orientation. The influence of the orientation of the electrode EL3 reaches the bit line through the stopper film 23 and the barrier metal film 28, thereby generating a risk that the resistance of the bit line BL is increased.

On the other hand, in the memory cell array 1 of the embodiment shown in FIG. 9, the nitridation process is performed to the surfaces of the interlayer insulating film 25 and the stopper film after the interlayer insulating film 25 is stacked. Therefore, the nitride film (block film 27) is formed on the surface of the polysilazane (PSZ) film that is used as the interlayer insulating film 25. Because the block film 27 blocks the gas emitted from the interlayer insulating film 25, the oxidation of the surface of the bit line BL can be suppressed, and the increase in wiring resistance can be suppressed. The surface of the stopper film 23 that is used as the stopper of the CMP is nitrided to form the adjustment film 26 made of the tungsten nitride. The tungsten nitride is closer to the amorphous structure than that of tungsten, and the adjustment film 26 easily reduces the influence of the orientation of the electrode EL3. Therefore, the increase in resistance, which is caused by the orientation of the electrode EL3, can be suppressed in the bit line BL formed on the adjustment film 26. In the memory cell array 1 of the embodiment, the barrier metal film 28 formed below the bit line BL as shown in the comparative example of FIG. 15 can be eliminated unlike the memory cell array of the comparative example, and the bit line BL is easy to process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of first wirings disposed in parallel;
a plurality of second wirings disposed to intersect the first wirings;
a memory cell array including a memory cell, the memory cell being disposed at each intersection of the first wiring and the second wiring and having a first electrode, a rectifying element, a second electrode, a variable resistor, and a third electrode connected in series; and
an interlayer insulating film deposited on the memory cell array, the interlayer insulating film being made of a first insulating material,
the memory cell array including:
a stopper film between the third electrode and the first wiring, the stopper film being made of a first metallic material and having a polishing rate different from that of the interlayer insulating film;
an adjustment film, the adjustment film being made of nitride of the first metallic material and being in contact with the first wiring; and
a block film between the interlayer insulating film and the first wiring, the block film containing nitride of the first insulating material,
an undersurface of the block film being higher than an undersurface of the stopper film, and
the stopper film being made of tungsten.

2. The semiconductor storage device according to claim 1, wherein the adjustment film and the block film are formed with a substantially identical thickness.

3. The semiconductor storage device according to claim 1, wherein the third electrode is made of titanium nitride and the adjustment film is made of tungsten nitride.

4. The semiconductor storage device according to claim 1, further comprising a barrier metal film provided along with the first wiring.

5. The semiconductor storage device according to claim 1, wherein the first wiring and the second wiring are made of an identical material.

6. The semiconductor storage device according to claim 1, wherein the interlayer insulating film is formed by a polysilazane film, and the block film is formed by a film of nitrided polysilazane.

7. A semiconductor storage device comprising:
a plurality of first wirings disposed in parallel;
a plurality of second wirings disposed to intersect the first wirings;
a memory cell array including a memory cell, the memory cell being disposed at each intersection of the first wiring and the second wiring and having a first electrode, a rectifying element, a second electrode, a variable resistor, and a third electrode connected in series; and
an interlayer insulating film deposited on the memory cell array, the interlayer insulating film being made of a first insulating material,
a structure which includes the first wiring, the memory cell array, and the second wiring being stacked plural times,
the memory cell array including:
a stopper film between the third electrode and the first wiring, the stopper film being made of a first metallic material and having a polishing rate different from that of the interlayer insulating film;
an adjustment film, the adjustment film being made of nitride of the first metallic material and being in contact with the first wiring; and
a block film between the interlayer insulating film and the first wiring, the block film containing nitride of the first insulating material,
an undersurface of the block film being higher than an undersurface of the stopper film, and
the stopper film being made of tungsten.

8. The semiconductor storage device according to claim 7, wherein the adjustment film and the block film are formed with a substantially identical thickness.

9. The semiconductor storage device according to claim 7, wherein the third electrode is made of titanium nitride and the adjustment film is made of tungsten nitride.

10. The semiconductor storage device according to claim 7, further comprising a barrier metal film provided along with the first wiring.

11. The semiconductor storage device according to claim 7, wherein the first wiring and the second wiring are made of an identical material.

12. The semiconductor storage device according to claim 7, wherein the interlayer insulating film is formed by a polysilazane film, and the block film is formed by a film of nitrided polysilazane.

* * * * *